United States Patent [19]

Katayama et al.

[11] Patent Number: 5,372,677
[45] Date of Patent: Dec. 13, 1994

[54] METHOD OF MANUFACTURING SEMICONDUCTOR DEVICES

[75] Inventors: Satoshi Katayama; Kenichi Nitta; Katsuhiko Iimura, all of Chiyoda, Japan

[73] Assignee: Kawasaki Steel Corporation, Kobe, Japan

[21] Appl. No.: 991,420

[22] Filed: Dec. 16, 1992

[30] Foreign Application Priority Data

Dec. 18, 1991 [JP] Japan .................. 3-335081

[51] Int. Cl.$^5$ ............................................ H01L 21/00
[52] U.S. Cl. ................... 156/659.1; 156/660; 156/661.1; 156/643; 156/650; 156/668
[58] Field of Search ............ 156/659.1, 643, 646, 156/668, 661.1, 660, 650

[56] References Cited

FOREIGN PATENT DOCUMENTS

| | | |
|---|---|---|
| 54-3473 | 11/1979 | Japan . |
| 58-108744 | 6/1983 | Japan . |
| 59-211231 | 11/1984 | Japan . |
| 63-86434 | 4/1988 | Japan . |
| 01155625 | 6/1989 | Japan . |
| 3-227010 | 10/1991 | Japan . |
| 3-259528 | 11/1991 | Japan . |
| 04107915 | 4/1992 | Japan . |

OTHER PUBLICATIONS

"Modification of Photoresist Surface-Involves Short Treatment in Oxygen Plasma to Remove Up to 100 Angstrom of Resist Surface to Improve Adhesion of Subsequent Coatings"; RD-310, 104-A; Feb. 10, 1990; Aron-Abstract Only.

*Primary Examiner*—R. Bruce Breneman
*Assistant Examiner*—George Goudreau
*Attorney, Agent, or Firm*—Oliff & Berridge

[57] ABSTRACT

After a silicon nitride film (2) is etched by using a first resist pattern (3A) as a mask before coating a second resist (4) superposing on the first resist pattern (3A), a surface layer portion of the first resist pattern (3A) is subjected to a plasma treatment by using oxygen ($O_2$). A properties changed layer in the surface layer portion of the first resist pattern (3A) is removed or modified to improve the adhesion between the second resist (4) and the first resist pattern (3A), and the stripping of the second resist (4) is prevented.

1 Claim, 1 Drawing Sheet

METHOD OF MANUFACTURING SEMICONDUCTOR DEVICES

BACKGROUND OF THE INVENTION

1. Field of the Invention

The present invention relates to a method of manufacturing semiconductor devices, and in particular, to a method of manufacturing semiconductor devices including a step of coating a resist superposing on a resist pattern which has been used as a mask for etching, so that the stripping of the resist of the upper layer side is prevented.

2. Description of the Prior Art

In a manufacturing process of a semiconductor device, a series of steps including coating of a resist, forming a resist pattern, etching by using the resist pattern as a mask, and stripping the resist are repeated. Accordingly, if this series of steps can be simplified, it will contribute to a reduction of time required for the overall manufacturing process to a great extent.

From the stand point of this view, a method is frequently employed in which without stripping the resist which has been used for etching, a resist for forming the next resist pattern is coated superposing on the previous resist.

However, when the resist is coated superposing on the previous resist, without stripping the previous resist which has been used for etching, a problem arises in which the adhesion between the lower layer side resist and the upper layer side resist is not satisfactory and the upper layer side resist is apt to be stripped.

The cause is considered to be that foreign atoms are mixed with a surface layer portion of the lower layer side resist due to the performance of the etching, and the coupling of the lower layer side resist with the upper layer side resist is disturbed, or that the surface tension of the lower layer side resist is increased as a result of subjecting to the etching precess.

To solve these problems, there is a method in which a surface layer portion of the lower layer side resist is etched or modified by treating the surface layer portion with a developing solution before coating the upper layer side resist. However, in this method, it is sure that the probability of causing the stripping of the upper layer side resist is reduced, however, it takes a time for removing the surface layer portion. As a result, in fact only a very shallow portion (about 10 to 20 Å) of the lower layer side resist is removed, and the upper layer side resist will be stripped depending on a thickness of the surface modified portion of the lower layer side resist. Furthermore, since the stripping of the upper layer side resist is found at a point of time when a series of steps of coating, exposing, and developing has been finished, it is necessary to perform again another series of steps of stripping the resist, treating with a developing solution, coating a resist, exposing, and developing. Accordingly, there is a loss of a great amount of time.

SUMMARY OF THE INVENTION

The present invention was made in view of the unsolved problems in the prior art, and it is an object of the present invention to provide a method of manufacturing a semiconductor device which enables to further reduce the occurrence of stripping of the upper layer side resist.

In order to achieve the object, in a first aspect of the invention, in a method of manufacturing a semiconductor device including the steps of forming a resist pattern on a film to be etched, etching the film to be etched by using the resist pattern as a mask, and coating a resist superposing on the resist pattern after performing the etching of the film to be etched, the improvement includes the step of treating a surface layer of the resist pattern with a plasma after performing the etching of the film to be etched and before performing the coating of the resist.

In a second aspect of the invention, in a method of manufacturing a semiconductor device including the steps of forming a resist pattern on a film to be etched, etching the film to be etched with a plasma by using the resist pattern as a mask, and coating a resist superposing on the resist pattern after performing the etching of the film to be etched, the improvement includes the step of treating a surface layer of the resist pattern with a plasma successively to the etching of the film to be etched in a same apparatus as that used for the etching followed by the coating of the resist.

In a third aspect of the invention, in the method of manufacturing a semiconductor device in the first aspect or in the second aspect of the invention, the plasma treatment is performed by using oxygen ($O_2$).

In the first aspect of the invention, as a result of the plasma treatment, the surface layer portion of the resist pattern which is used as a mask at the time of etching the film to be etched is etched or modified to a relatively deep portion. Accordingly, even when the resist is coated superposing on the resist pattern, the adhesion between the resist pattern and the resist is strong, and the resist is not stripped.

Furthermore, in the second aspect of the invention, after the etching of the film to be etched with the plasma, successively to the etching, the plasma treatment is performed in the same apparatus as that used in the etching. Accordingly, the labour hour for the transportation of a wafer is not necessary. Furthermore, as is the case in the first aspect of the invention, as a result of the plasma treatment, the surface layer portion of the resist pattern which is used as a mask at the time of etching the film to be etched is etched or modified to a relatively deep portion. Accordingly, even when the resist is coated superposing on the resist pattern, the adhesion between the resist pattern and the resist is strong, and the upper resist is not stripped.

In the third aspect of the invention, in the method of manufacturing a semiconductor device in the first aspect or in the second aspect of the invention, since the plasma treatment is performed by using oxygen ($O_2$), the surface layer portion of the resist pattern is etched or modified in a short time, and a portion except the resist is not damaged.

DESCRIPTION OF THE PREFERRED EMBODIMENT

The present invention will be described with reference to FIGS. 1a to 1e.

Figure 1A:
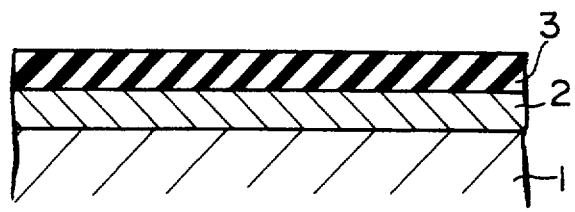
FIGS. 1a to 1e are respectively sectional views illustrating a manufacturing process of a semiconductor device in an embodiment of the present invention.

First, a silicon nitride film ($Si_3N_4$) 2 which is a film-to-be-etched is formed or laminated to a thickness of 1000 Å, for example, by a reduced pressure chemical vapor deposition (CVD) apparatus on a semiconductor substrate 1 constituted by silicon or the like. Subsequently, a first resist 3 is coated on the silicon nitride film 2 to a thickness of 1.2 to 1.5 μm as shown in FIG. 1a.

As the first resist 3, although a novolak series resin material is used, another material such as a negative resist, a positive resist, resist for a g line stepper, an i line stepper, or a PIO (polyimide resin) may be used.

Figure 1B:
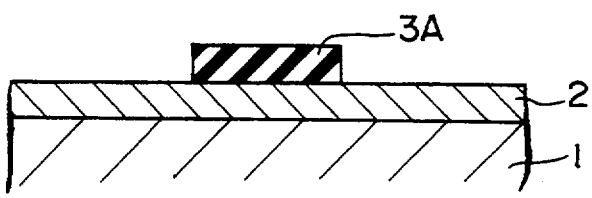
Figure 1C:
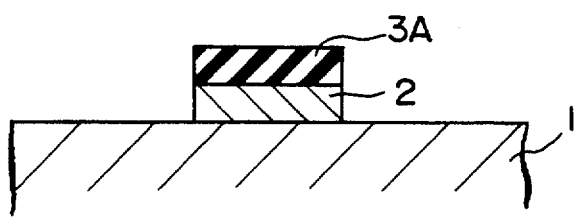

Following this, the first resist 3 is patterned by exposure and development to form a first resist pattern 3A as shown in FIG. 1b. Then, etching with a plasma, for example, plasma etching or reactive ion etching is performed by using the first resist pattern 3A as a mask, so that the silicon nitride film 2 is etched as shown in FIG. 1c.

In the etching of the silicon nitride film 2, normally, a fluorine (F) series gas such as $CF_4$, $CHF_3$, or the like is used. Accordingly, as a result of the etching of the silicon nitride film 2, a properties changed layer containing a great amount of F elements of about 50 to 100 Å is formed in a surface layer of the first resist pattern 3A. This layer having the properties changed can be confirmed by the fact that the amount of F elements is large in the surface layer portion according to a secondary ion mass spectrometer (SIMS) analysis.

For this reason, after the etching of the silicon nitride film 2, the properties changed layer in the surface layer of the first resist pattern 3A is removed by performing a plasma treatment using oxygen ($O_2$) successively to the etching and in the apparatus in which the etching has been performed.

Figure 1D:
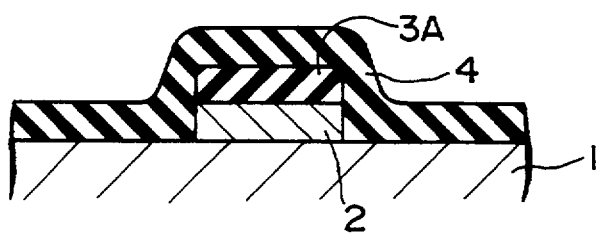
Figure 1E:
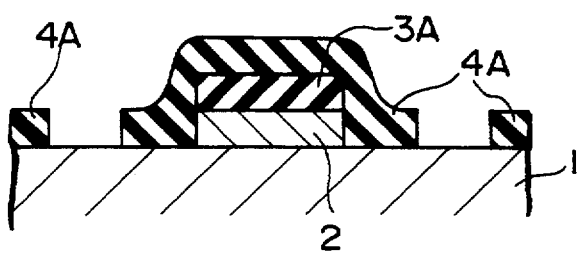

Thereafter, a second resist 4 is coated superposing on the first resist pattern 3A as shown in FIG. 1d. Following this, the second resist 4 is exposed and developed thereby to form a second resist pattern 4A as shown in FIG. 1e.

Here, the plasma treatment to remove the surface layer portion of the first resist pattern 3A to a thickness of 50 Å is carried out under the following conditions in which in the same apparatus as that used for the etching, $O_2$ is supplied at a flow rate of 20 cc/min, He is supplied at a flow rate of 100 cc/min, a pressure of 300 mtorr is applied, a wafer is placed on a lower electrode installed in the apparatus, radio frequency (RF) electric power of 50 w at a 13.56 MHz is applied to an upper electrode, and a plasma is generated for 7 seconds. As a result of this plasma treatment, it was found that the occurrence rate of stripping of the second resist pattern 4A was 0% (an experimental value obtained by the inventors).

As described above, the reason for the improvement in the adhesion between the first resist pattern 3A and the second resist pattern 4A is that since the surface layer portion of the first resist pattern 3A is removed by the plasma treatment using $O_2$, the surface layer portion can be removed at a high rate, and the properties changed layer can be removed entirely in a very short time without failure. In this respect, when the second resist 4 is coated without performing any treatment of the first resist pattern 3A, the occurrence rate of stripping of the second resist pattern 4A was about 8%, and when the first resist pattern 3A is treated with a developing solution, the occurrence rate of stripping was about 4%.

As described above, In the present embodiment, since the stripping of the second resist pattern 4A can be prevented substantially completely, the probability or necessity of coating the second resist 4 again can be eliminated substantially completely. As a result, the reduction of time for the manufacturing process of the semiconductor device can be achieved. Furthermore, since the plasma treatment of the surface layer portion of the first resist pattern 3A can be performed by merely changing a gas to be introduced and successively to the etching of the silicon nitride film 2 in the same apparatus used for the etching of the silicon nitride film 2. Accordingly, there is no need to install a new apparatus particularly, and an increase of costs to a great extent can be prevented.

Furthermore, since $O_2$ is used in the plasma treatment, there is substantially no risk of causing damage in a portion except the first resist pattern 3A.

Also, in the above embodiment, it is described as to the case in which dry etching of the silicon nitride film 2 using the plasma is employed, however, the etching of the silicon nitride film 2 may be performed by wet etching. Specifically, in the case where a wet etching liquid containing a great amount of COOH groupes is used, since a surface layer of the resist after the etching contains a great amount of OH groupes and the properties of the surface layer are changed, if the plasma treatment as in the above embodiment is carried out before coating a resist superposing on the surface layer of the resist, the occurrence rate of the stripping of the resist will be reduced remarkably.

Furthermore, in the above embodiment, although the silicon nitride film 2 is used as the film-to-be-etched, the present invention is not limited to this, and a wiring material such as polysilicon or aluminum may be used as the film-to-be-etched.

Furthermore, although $O_2$ is most suitable as the gas introduced at the time of performing the plasma treatment as described above, the gas is not necessarily limited to $O_2$. However, gases of the F series are not applicable.

As described above, the present invention provides the following advantages or meritorious technical effects.

Since the surface layer of the lower layer side resist pattern is plasma treated, after the film-to-be-etched is etched and before coating the upper layer side resist, the properties changed layer in the surface portion of the resist pattern can be removed, and the adhesion between the lower layer side resist pattern and the upper layer side resist is improved so that the stripping of the resist seldom occurs.

In particular, in the second aspect of the invention, since the plasma treatment by $O_2$ can be performed successively to the etching, there is no need to install a new apparatus particularly, and an increase of costs to a great extent can be prevented.

Furthermore, in the third aspect of the invention, the surface layer of the resist pattern can be removed at a high rate, or can be modified, and there is no risk of causing damage in the other portions.

What is claimed is:

1. A method of manufacturing a semiconductor device comprising the steps of:
   forming a resist pattern on a film;
   etching said film with a first plasma in a plasma-etching apparatus using said resist pattern as a mask;
   removing a top portion of said resist pattern in the plasma-etching apparatus after etching said film, wherein said top portion is removed with a second plasma comprising $O_2$ gas; and
   coating a resist on said etched resist pattern after removing the top portion of the resist pattern.

* * * * *